United States Patent [19]
Sakamoto et al.

[11] Patent Number: 4,969,168
[45] Date of Patent: Nov. 6, 1990

[54] WAFER SUPPORTING APPARATUS

[75] Inventors: Eiji Sakamoto, Sagamihara; Shinichi Hara, Atsugi; Isamu Shimoda, Zama; Shunichi Uzawa, Tokyo, all of Japan

[73] Assignee: Canon Kabushiki Kaisha, Tokyo, Japan

[21] Appl. No.: 401,654

[22] Filed: Aug. 31, 1989

[30] Foreign Application Priority Data

Sep. 2, 1988 [JP] Japan .................. 53-218521

[51] Int. Cl.⁵ .............................................. G21K 5/00
[52] U.S. Cl. ...................................... 378/34; 378/208; 250/440.1
[58] Field of Search ......................... 378/34–35, 378/208; 250/492.2, 491.1, 440.1–443.1; 269/21, 24; 271/276

[56] References Cited

U.S. PATENT DOCUMENTS 3,711,081 1/1973 Cachen .......................... 269/24
4,667,110 5/1987 Kariya .......................... 250/440.1
4,869,481 9/1989 Yabo et al. ..................... 269/21

Primary Examiner—Carolyn E. Fields
Assistant Examiner—David P. Porta
Attorney, Agent, or Firm—Fitzpatrick, Cella, Harper & Scinto

[57] ABSTRACT

A wafer chuck usable with a semiconductor exposure apparatus wherein a mask and a semiconductor wafer are placed in a vacuum ambience or a pressure-reduced gas ambience, and wherein the wafer is exposed through the mask to radiation energy such as X-rays contained in a synchrotron radiation beam, by which the pattern of the mask is transferred onto the wafer. The wafer is first attracted on the wafer supporting surface of the chuck by vacuum attraction, and thereafter, the wafer is attracted by the electrostatic attraction force. Thereafter, the vacuum attraction is broken by supplying a gas. When the pattern of the mask is transferred onto the wafer, the wafer is retained on the wafer supporting surface by the electrostatic attraction force only. By this, the sheet-like member (wafer) supporting apparatus can correctly contact the wafer supporting surface to the wafer without being influenced by the undulation of the wafer. In addition, the heat produced in the wafer during exposure can be removed efficiently by temperature controlled water supplied to the wafer supporting apparatus.

8 Claims, 4 Drawing Sheets

WAFER SUPPORTING APPARATUS

FIELD OF THE INVENTION AND RELATED ART

The present invention relates to a wafer supporting apparatus, more particularly to a wafer supporting apparatus usable with a semiconductor exposure apparatus wherein a mask and a semiconductor wafer are disposed in a vacuum or a predetermined reduced ambience; a predetermined exposure energy, for example, X-rays contained in a radiation from SOR (Synthetic Orbit Radiation) is applied to the wafer through the mask, by which the pattern of the mask is transferred onto the wafer.

A wafer supporting apparatus including a vacuum attracting means utilizing vacuum attracting force and a wafer supporting apparatus having an electrostatic attracting means utilizing electrostatic force, are known. Referring first to FIGS. 3A and 3B, there is shown a vacuum attracting type wafer supporting apparatus. FIG. 3A is a top plan view thereof, and FIG. 3B is a sectional view. On the top surface of the supporting apparatus 102, vacuum attracting grooves 104 are formed, the grooves communicating with unshown an vacuum source through a vacuum pipe 103. The wafer 101 is placed on the top surface of the apparatus 102, that is, on the contact surface, and is vacuum-attracted by the vacuum grooves 104, wherein the ambient pressure to the top surface of the wafer 101 is effective to urge the wafer 101 to the apparatus 102.

Referring then to FIGS. 4A and 4B, FIG. 4A is a top plan view, and FIG. 4B is a sectional view. On the top surface of the apparatus 202 an electrode 208 is disposed, and the top surface thereof is covered with an insulating layer 203. The wafer 201 is placed on the top surface (contact surface) of the insulating layer 203, and a voltage is applied to the electrode 208. By the application of the voltage, an electrostatic force is produced to attract the wafer on the contact surface.

SUMMARY OF THE INVENTION

In the conventional vacuum attraction type wafer supporting apparatus, a vacuum layer exists between the wafer and the contact surface of the apparatus with the result of significantly large resistance to the contact heat transfer. For example, when comparison is made between the vacuum attraction and the electrostatic attraction in the ambient condition of normal temperature and normal pressure, the resistance to the contact heat transfer between the wafer and wafer carrying surface is $10^{-2}$ K.m$^2$/W in the vacuum attraction, whereas it is $10^{-4}$ K.m$^2$/W in the electrostatic attraction, and therefore, the resistance is larger by approximately two orders in the vacuum attraction than in the electrostatic attraction. The heat produced in the wafer by absorption of exposure energy during the pattern transfer operation from the mask to the wafer is not easily released to the supporting apparatus in the vacuum attraction. When the apparatus is used with an exposure apparatus wherein the wafer is disposed in an ambience having a low thermal conductivity, such as vacuum ambience, the temperature rise of the wafer is a problem. Particularly when the exposure operation is performed with the mask and the wafer being placed close to each other, the temperature rise of the mask as well as of the wafer is an additional problem. If the temperature of the mask rises, the pattern formed thereon is thermally deformed.

In a wafer supporting apparatus of the electrostatic attraction type, when the electrode carrying the wafer on the attracting surface is supplied with the voltage, the attraction force is larger in the portion where the gap between the wafer and the attraction surface is smaller than where it is larger. Since the attraction force is smaller where the gap is large, the attraction force over the surface of the wafer is not uniform due to undulation. In some cases, the undulation is not corrected. In an extreme case, the wafer is dismounted from the supporting apparatus.

Accordingly, it is a principal object of the present invention to provide a wafer supporting apparatus wherein the contact heat transfer resistance to the wafer is small, and wherein the wafer is positively and assuredly supported on the supporting surface.

According to an aspect of the present invention, the wafer supporting apparatus is provided with vacuum attracting means and electrostatic attracting means. In operation, the wafer is first attracted by both the vacuum attracting force and the electrostatic attracting force on the supporting surface, thereafter, the vacuum attracting means is supplied with an ambient gas while the wafer is being attracted by the electrostatic attracting means, by which the contact heat transfer resistance is reduced.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

The preferred embodiment will be described in conjunction with the accompanying drawings. In the Figures, the wafer supporting apparatus is shown as being used with a semiconductor exposure apparatus, although not shown, wherein a mask and a wafer are disposed in a vacuum ambience or a pressure-reduced ambience, and wherein a predetermined exposure energy such as X-rays contained in a synchrotron radiation beam is projected through the mask to the wafer, by which the pattern formed in the mask is transferred onto the wafer.

Figure 1:
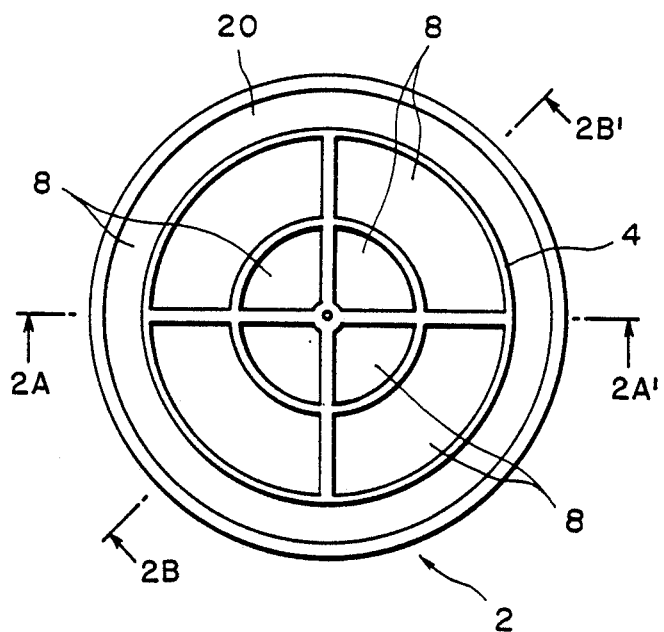
FIG. 1 is a top plan view of a wafer supporting apparatus according to an embodiment of the present invention.
Figure 2A:
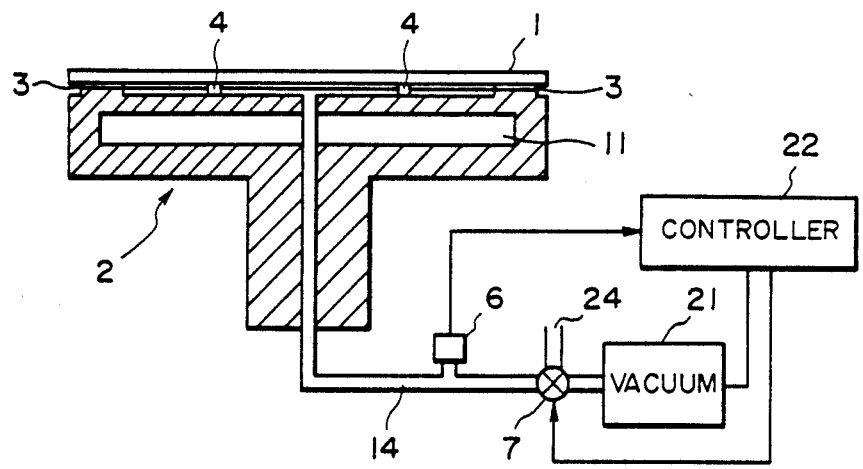
FIG. 2A is a sectional view taken along a line A-A' of FIG. 1.
Figure 2B:
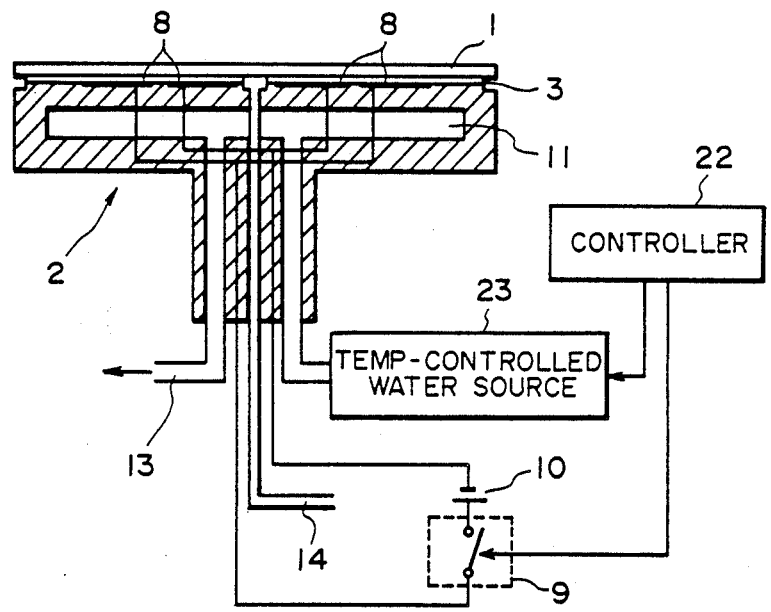
FIG. 2B is a sectional view taken along a line B-B' of FIG. 1.
Figure 3A:
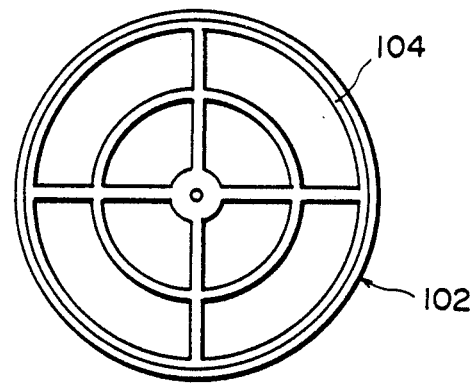
FIG. 3A is a top plan view of a conventional vacuum attraction type wafer supporting means.
Figure 3B:
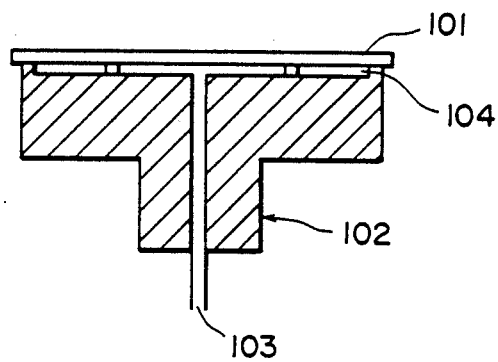
FIG. 3B is a sectional view of the apparatus of FIG. 3A.
Figure 4A:
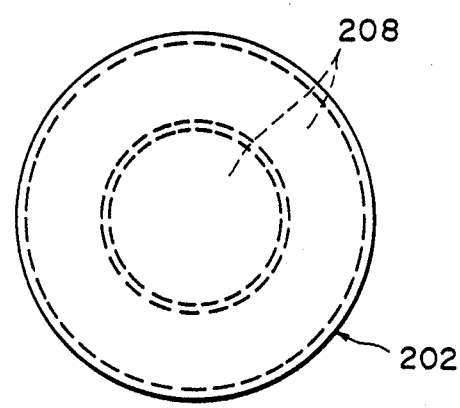
FIG. 4A is a top plan view of a wafer supporting apparatus of a conventional electrostatic attraction wafer supporting apparatus.
Figure 4B:
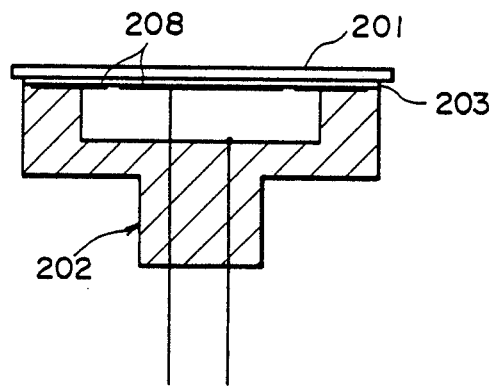
FIG. 4B is a sectional view of an apparatus of FIG. 4A.

In FIGS. 1, 2A and 2B, reference numeral 1 designates a semiconductor wafer onto which the pattern of the mask is to be transferred or printed. The wafer supporting apparatus of this embodiment includes a wafer supporting main assembly 2 for supporting the wafer 1 at an exposure position where the mask pattern is transferred thereonto and an insulating layer 3 constituting a contact surface with the wafer 1. The main assembly 2 is made of ceramic material such as $Al_2O_3$ or SiC or metal such as SUS, Al. The insulating layer 3 is made of a material having high dielectric constant such as $Al_2O_3$. The thickness thereof is approximately 50-400 microns. If the thickness of the insulating layer 3 is smaller, the electrostatic attraction force is larger. However, when high voltage is applied, the dielectric break down can easily occur. On the other hand, if it is large, the electrostatic force is small. In this embodiment, fused $Al_2O_3$ is applied, and then it is abraded into the thickness of 100 microns. The top surface of the insulating layer 3 is formed into a contact surface 20 for contact with the wafer 1. The contact surface 20 is provided with vacuum attraction grooves 4 as shown in FIG. 1 in the form of concentric circles. The vacuum attraction grooves 4 communicate with vacuum source 21 through a vacuum pipe 14. The vacuum pipe 14 is provided adjacent to the main assembly 2 with a pressure sensor 6 for detecting the pressure in the pipe 14. Between the pressure sensor 6 and the vacuum source 21, there is disposed a three way valve 7, by which the ambient gas or gases around the apparatus 24 can be introduced through a gas inlet 24 into the pipe at the pressure sensor 6 side.

Below the insulating layer 3 there is an electrode 3. The electrode 8 is electrically connected to a high voltage source 10 through a switch 9. By closing the switch 9, a high voltage is applied to the electrode 8, by which an electrostatic force is produced between the apparatus and the wafer 1. Thus, the wafer is attracted and fixed on the insulating layer 3. When the material of the main assembly 2 is electrically conductive, an additional insulating layer is provided on the bottom surface of the electrode 8.

In the main assembly 2, a water circulation region 11 is formed for circulating temperature control liquid (water) (temperature control medium). Into the circulation region 11, the cooling water controlled in its temperature at a predetermined level is supplied from a temperature controlled water source 23. The cooling water flows through the circulation region 11 to absorb heat from the main assembly 2 and the wafer 1, and thereafter, is discharged through an outlet 13. By this, the temperature rise during the exposure operation can be suppressed to maintain the temperature of the wafer 1 and the main assembly 2 at a predetermined level. The temperature-controlled water source 23 is controlled in temperature in response to instructions from a controller 22, and also is controlled in the flow rate.

In operation, the wafer is attracted in the following steps:

(1) The wafer 1 is placed on the insulating layer 3 of the main assembly 2, thereafter, the controller 22 switches the three way valve 7 to connect the pipe 14 with the vacuum source 21, and starts operation of the vacuum supply source 21.

(2) By this, the wafer 1 is vacuum-attracted by the vacuum attracting grooves 4 between the wafer 1 and the main assembly 2, so that the wafer 1 is vacuumattracted on the insulating layer 3. The controller 22 monitors through the pressure sensor 6 the pressure in the pipe 14, and confirms the attraction of the wafer 1 by the pressure in the pipe 14 beyond a predetermined pressure.

(3) After the vacuum attraction of the wafer 2 is confirmed, the controller 22 closes the switch 9 to apply the high voltage to the electrode 8, by which the wafer 1 is securely attracted to and retained on the main assembly 2 by both the vacuum-attracting force and the electrostatic attracting force.

(4) Then, the controller 22 stops operation of the vacuum source 21. Thereafter, the three way valve 7 is switched to open the gas introduction inlet 24 side to introduce the ambient gas or gases into the vacuum pipe 14, thus braking the vacuum. By this, the ambient gas is introduced between the wafer 1 and the contact surface of the insulating layer 3 of the main assembly 2, by which the resistance to the contact heat transfer therebetween reduces. The ambient gas is preferably He gas or the like having a high thermal conductivity. Thereafter, the exposure operation is started, and during the exposure wafer 1 is kept retained only by the electrostatic attraction force.

In this embodiment, the ambient gas around the main assembly 2 is introduced into the vacuum pipe 14 after the wafer is electrostatically attracted. However, it is a possible alternative that a gas supplying source is connected to the gas inlet 24 to introduce another gas or other gases into the pipe 14. When, the ambient gas has relatively low thermal conductivity, such as air or nitrogen, it is possible that a highly thermally conductive gas such as He can be introduced into the vacuum pipe 14 from the gas inlet 24, by which the resistance to the contact heat transfer between the wafer 1 and the main assembly 2 of the supporting apparatus can be reduced.

As described in the foregoing, according to the present invention, the wafer supporting means is provided with vacuum attraction means and electrostatic attraction means, by which the wafer can be assuredly retained and fixed on the wafer supporting surface. The undulation of the wafer can be corrected along the attracting surface of the supporting apparatus. In addition, the temperature rise of the wafer during the exposure operation of the wafer to the mask pattern can be suppressed. Therefore, the heat of the mask and the wafer can be removed efficiently, thus minimizing the thermal deformation of the mask pattern.

While the invention has been described with reference to the structures disclosed herein, it is not confined to the details set forth and this application is intended to cover such modifications or changes as may come within the purposes of the improvements or the scope of the following claims.

WHAT IS CLAIMED IS:

1. An apparatus for supporting a member, comprising:
   a surface for supporting the member;
   vacuum attraction means for attracting the member onto said supporting surface by vacuum attraction force;
   electrostatic attraction means for attracting the member onto said supporting surface by electrostatic force; and
   control means for operating said electrostatic attraction means after said vacuum attraction means is operated.

2. An apparatus according to claim 1, wherein said vacuum attraction means is provided with grooves formed on said supporting surface, a vacuum source for applying vacuum to said grooves and a gas inlet for supplying a gas into said grooves.

3. An apparatus according to claim 2, wherein said control means introduces gas through the gas inlet to said grooves after said electrostatic attraction means is operated.

4. An apparatus according to claim 2, wherein said control means stops operation of said vacuum attraction means and introduces through said gas inlet the gas into said grooves after said control means operates said electrostatic attraction means.

5. An apparatus according to claim 1, wherein said control means includes a pressure sensor, and wherein said control means operates said electrostatic attraction means after said control means detects by the pressure sensor secure retention of the member on said supporting surface by said vacuum attraction means.

6. A supporting apparatus for supporting a member, comprising:
- a main assembly having a supporting surface for supporting the member;
- temperature control means for circulating a temperature-controlled medium in said main assembly;
- vacuum attraction means for attracting the member on said supporting surface by vacuum attraction force;
- electrostatic attraction means for attracting the member onto said supporting surface by electrostatic force;
- control means for operating said electrostatic attraction means after operating said vacuum attraction means.

7. An apparatus according to claim 6, wherein said control means also controls said temperature control means.

8. An exposure apparatus wherein exposure energy is applied onto a wafer through a mask, by which a pattern formed in the mask is transferred onto the wafer, said exposive apparatus comprising:
- a main assembly having a wafer supporting surface;
- vacuum attraction means for attracting the wafer onto said wafer supporting surface by vacuum attraction force;
- electrostatic attraction means for attracting the wafer onto said wafer supporting surface by electrostatic attraction force;
- control means for operating said electrostatic attraction means after operating said vacuum attraction means, wherein said control means retains the wafer on said wafer supporting surface only by electrostatic attraction means during application of the exposure energy.

* * * * *

UNITED STATES PATENT AND TRADEMARK OFFICE
CERTIFICATE OF CORRECTION

PATENT NO. : 4,969,168
DATED : November 6, 1990
INVENTOR(S) : Eiji Sakamoto, et al.

It is certified that error appears in the above-identified patent and that said Letters Patent is hereby corrected as shown below:

ON THE TITLE PAGE

<u>IN THE U.S. PATENT DOCUMENTS</u>

"Cachen" should read --Cachon-- and "Yabo et al." should read --Yabu et al.--.

<u>COLUMN 1</u>

Line 25, "unshown an" should read --an unshown--.

<u>COLUMN 6</u>

Line 3, "force;" should read --force; and--;
Line 13, "said exposive apparatus" should read --said exposure apparatus--; and
Line 20, "force;" should read --force; and--.

Signed and Sealed this

Nineteenth Day of May, 1992

*Attest:*

DOUGLAS B. COMER

*Attesting Officer*     *Acting Commissioner of Patents and Trademarks*